United States Patent
Oda

[19]

[11] Patent Number: 5,990,003
[45] Date of Patent: Nov. 23, 1999

[54] METHOD OF FABRICATING A SEMICONDUCTOR DEVICE

[75] Inventor: Noriaki Oda, Tokyo, Japan

[73] Assignee: NEC Corporation, Tokyo, Japan

[21] Appl. No.: 08/838,985

[22] Filed: Apr. 23, 1997

[30] Foreign Application Priority Data

Apr. 24, 1996 [JP] Japan ................................ 8-102261

[51] Int. Cl.⁶ ............................................. H01L 21/00
[52] U.S. Cl. ......................... 438/637; 438/738; 216/18; 216/47; 216/72
[58] Field of Search .................. 216/18, 41, 47, 216/67, 79; 438/637, 672, 725, 736, 738

[56] References Cited

U.S. PATENT DOCUMENTS

| | | | |
|---|---|---|---|
| 4,806,453 | 2/1989 | Vidusek et al. | 430/312 |
| 4,814,041 | 3/1989 | Auda | 156/643 |
| 5,679,269 | 10/1997 | Cohen et al. | 216/72 |
| 5,827,780 | 10/1998 | Hsia et al. | 438/692 |
| 5,833,817 | 11/1998 | Tsai et al. | 204/192.17 |

FOREIGN PATENT DOCUMENTS

| | | |
|---|---|---|
| 60-115248 | 6/1985 | Japan . |
| 2-90614 | 3/1990 | Japan . |
| 8-83842 | 3/1996 | Japan . |

OTHER PUBLICATIONS

S. M. Irving; "A Plasma Oxidation Process for Removing Photoresist Films"; Solid State Technology, Jun. 1971, pp. 47–51.

Japanese Office Action dated Mar. 24, 1998 with English language translation of Japanese Examiner's comments.

*Primary Examiner*—Bruce Breneman
*Assistant Examiner*—Alva C. Powell
*Attorney, Agent, or Firm*—Whitham, Curtis & Whitham

[57] ABSTRACT

There is provided a method of fabricating a semiconductor, including the steps, in sequence, of (a) forming a first interlayer insulating film over a semiconductor substrate, (b) forming an electrically conductive contact hole in the first interlayer insulating film, (c) forming a second interlayer insulating film over the first interlayer insulating film, (d) forming a photosensitive organic film over the second interlayer insulating film, (e) forming a via-hole passing through the photosensitive organic film and the second interlayer insulating film, the via-hole being in vertical alignment with the contact hole, (f) forming a film so that the film covers the photosensitive organic film therewith and fills the via-hole therewith, (g) exposing the film to plasma so that a portion of the film lying over the photosensitive organic film is removed, (h) removing both the photosensitive organic film and the film remaining in the via-hole, and (i) forming a wire above the via-hole. In accordance with the above mentioned method, the cured layer formed on the photosensitive organic film is removed by being exposed to plasma in oxygen atmosphere with the via-hole being filled with the film. Thus, the second interlayer insulating film defining an inner wall of the via-hole is not exposed directly to oxygen plasma, and hence is not etched by the plasma. As a result, it is possible to prevent that the via-hole has a greater side length than a designed side length.

16 Claims, 5 Drawing Sheets

METHOD OF FABRICATING A SEMICONDUCTOR DEVICE

BACKGROUND OF THE INVENTION

1. Field of the Invention

The invention relates to a method of fabricating a semiconductor device, and more particularly to a method of fabricating a semiconductor device in which a wire is to be formed above a via-hole.

2. Description of the Related Art

One of conventional methods of fabricating a semiconductor device is explained hereinbelow with reference to FIGS. 1A to 1E.

As illustrated in FIG. 1A, there are formed device isolation regions 3 at a surface of a semiconductor substrate 1, and diffusion layers 2 adjacent to the device isolation regions 3. A gate oxide film 21 is formed at a surface of the semiconductor substrate 1 between the diffusion layers 2. There is formed a gate electrode 22 on the gate oxide film 21. The gate electrode 22 and the gate oxide film 21 are covered at their side surfaces with sidewalls 23.

Then, a resultant is covered with a first interlayer insulating film 4. Then, there are formed contact holes 5 by photolithography and etching. The contact holes 5 pass through the first interlayer insulating film 4 and reach the diffusion layers 2. Then, there is formed a barrier metal film 12 on an inner surface of the contact holes 5. The barrier metal film is constituted of an about 30 nm-thick titanium film and an about 100 nm-thick titanium nitride film. Then, a resultant is covered with a tungsten film 13 by chemical vapor deposition (CVD) employing $WF_6$ and $H_2$ gases as source gases. Then, the tungsten film 13 is etched back to thereby fill the contact holes 5 with tungsten 13.

Then, a first wiring layer 6 is formed over a resultant by sputtering, and subsequently patterned in a desired pattern by photolithography and reactive ion etching. Before or while the above mentioned steps are carried out, the semiconductor substrate 1 is processed to have a desired impurity profile therein by ion implantation and annealing and all that.

Then, as illustrated in FIG. 1B, a hydrogenated amorphous carbon film 7 is formed by about 0.1 μm over a resultant, and a fluorinated amorphous carbon film 8 is formed by about 1.0 μm over the hydrogenated amorphous carbon film 7.

Then, as illustrated in FIG. 1C, photoresist 9 is formed by about 1.0 μm over the fluorinated amorphous carbon film 8. Then, the photoresist 9 is exposed to light at a portion where via-holes 10 are to be formed, and developed to thereby remove the portion of the photoresist 9. With the photoresist 9 being partially removed, reactive ion etching (RIE) is carried out to thereby etch the fluorinated amorphous carbon 8 and the hydrogenated amorphous carbon 7. As a result, there are formed via-holes 10. Since the photoresist 9 is exposed to plasma during the reactive ion etching, there is formed a cured layer 11 at the top of the photoresist 9, as illustrated in FIG. 1C.

Then, the cured layer 11 formed on the photoresist 9 is exposed to plasma in oxygen atmosphere to thereby remove the cured layer 11. Thereafter, the photoresist 9 is removed by organic release solution, as illustrated in FIG. 1D.

Then, as illustrated in FIG. 1E, a barrier metal film 32 is formed on an inner surface of the via-holes 10. The barrier metal film 32 consists of an about 30 nm-thick titanium film and an about 100 nm-thick titanium nitride film. Then, a tungsten film 33 is deposited over a resultant by CVD employing $WF_6$ and $H_2$ gases as source gases. Thereafter, the tungsten film 33 is etched back to thereby fill the via-hole 10 with tungsten 33. Then, an aluminum layer 14 is deposited over a resultant by sputtering, and thereafter is patterned, as illustrated in FIG. 1E.

In the above mentioned conventional method, when the cured layer 11 formed on the photoresist 9 by reactive ion etching is removed by plasma in oxygen atmosphere, an inner wall of the via-hole 10 is also etched, as illustrated in FIG. 1D, thereby posing a problem that the via-holes 10 have a greater side length than a designed side length.

With respect to photoresist removal, processing variables such as photoresist type are discussed in "A Plasma Oxidation Process for Removing Photoresist Films", Stephen M. Irving, Solid State Technology, June 1971, pp. 47–51.

SUMMARY OF THE INVENTION

In view of the foregoing problem of the conventional method, it is an object of the present invention to provide a method in which an inner wall of a via-hole is not etched even when a cured layer formed on photoresist is removed by plasma in oxygen atmosphere.

There is provided a method of removing a cured layer formed on a photosensitive organic film deposited on an interlayer insulating film, a via-hole being formed passing through the cured layer, the photosensitive organic film, and the interlayer insulating film, the method including the steps, in sequence, of (a) forming a film so that the film covers the cured layer therewith and fills the via-hole therewith, (b) exposing the film to plasma so that the cured layer and a portion of the film lying over the cured layer are removed together, and (c) removing both the photosensitive organic film and the film remaining in the via-hole.

There is further provided a method of fabricating a semiconductor, including the steps, in sequence, of (a) forming a first interlayer insulating film over a semiconductor substrate, (b) forming an electrically conductive contact hole in the first interlayer insulating film, (c) forming a second interlayer insulating film over the first interlayer insulating film, (d) forming a photosensitive organic film over the second interlayer insulating film, (e) forming a via-hole passing through the photosensitive organic film and the second interlayer insulating film, the via-hole being in vertical alignment with the contact hole, (f) forming a film so that the film covers the photosensitive organic film therewith and fills the via-hole therewith, (g) exposing the film to plasma so that a portion of the film lying over the photosensitive organic film is removed, (h) removing both the photosensitive organic film and the film remaining in the via-hole, and (i) forming a wire above the via-hole.

The above mentioned step (e) may include the steps of exposing the photosensitive organic film to light in vertical alignment with the contact hole, and developing exposed portion of the photosensitive organic film, and etching the second interlayer insulating film in a selected area to thereby form the via-hole. For instance, the second interlayer insulating film may be etched by reactive ion etching (RIE).

The first interlayer insulating film may contain amorphous carbon therein. For instance, the first interlayer insulating may include a hydrogenated amorphous carbon film and a fluorinated amorphous carbon deposited on the hydrogenated amorphous carbon film.

The photosensitive organic film may be made of photoresist. The film may be made of photoresist or polyimide. The film may be made of the same material as material of which the photosensitive organic film is made.

In accordance with the above mentioned method, the cured layer formed on the photosensitive organic film is removed by being exposed to plasma in oxygen atmosphere with the via-hole being filled with the film. Thus, the second interlayer insulating film defining an inner wall of the via-hole is not exposed directly to oxygen plasma, and hence is not etched by the plasma. As a result, it is possible to prevent that the via-hole has a greater side length than a designed side length.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

The first embodiment in accordance with the present invention is explained hereinbelow with reference to FIGS. 2A to 2E.

Figure 1A:
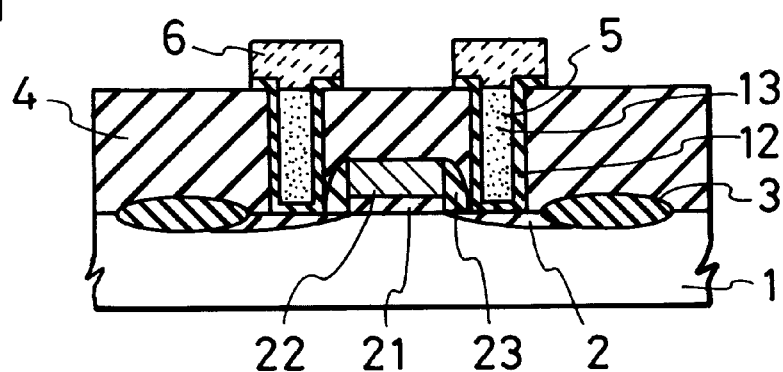
FIGS. 1A to 1E are cross-sectional views of a semiconductor device, illustrating respective steps of a conventional method of fabricating a semiconductor device.
Figure 1B:
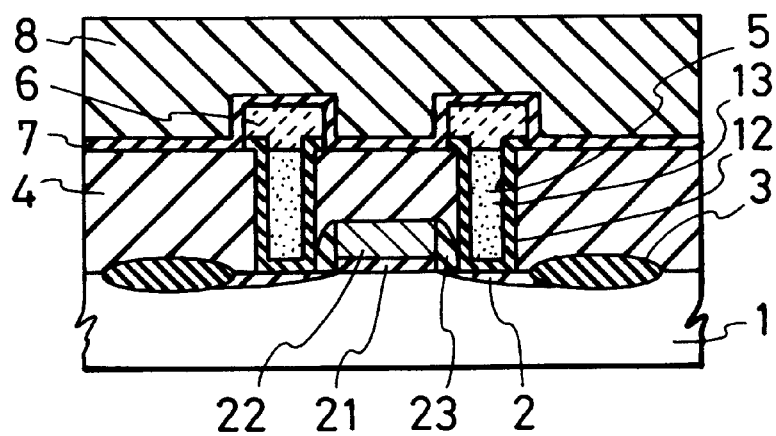
Figure 1C:
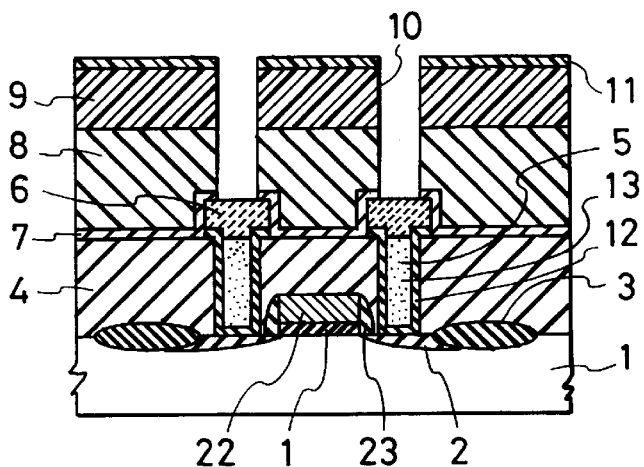
Figure 1D:
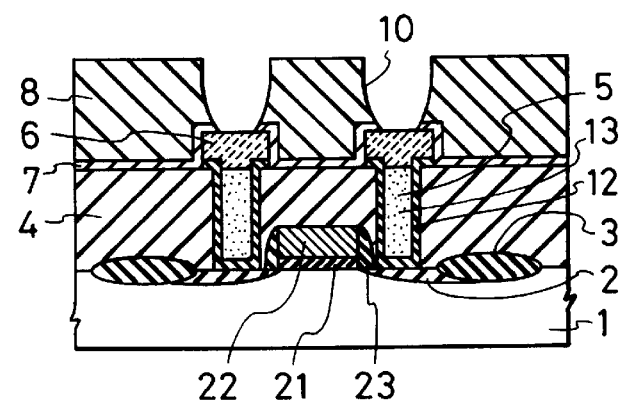
Figure 1E:
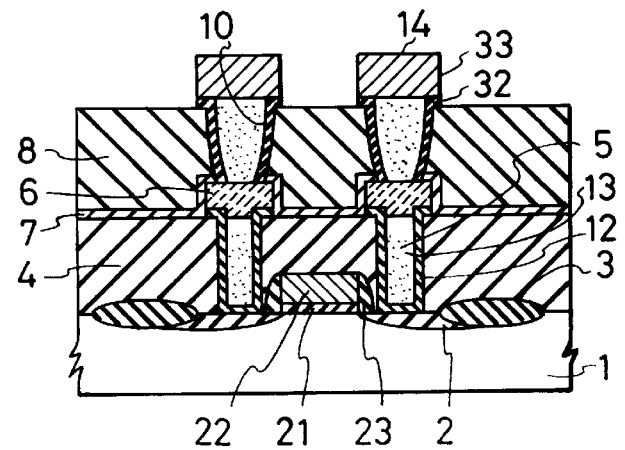
Figure 2A:
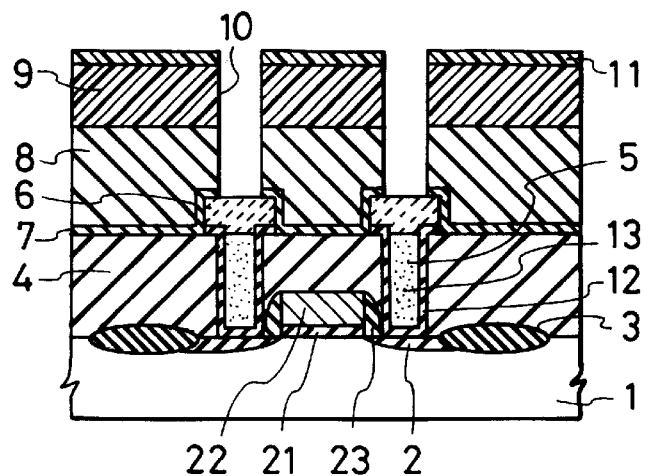
FIGS. 2A to 2E are cross-sectional views of a semiconductor device, illustrating respective steps of a method in accordance with the first embodiment of the present invention.

As illustrated in FIG. 2A, there are formed device isolation regions 3 at a surface of a semiconductor substrate 1, and diffusion layers 2 adjacent to the device isolation regions 3. A gate oxide film 21 is formed at a surface of the semiconductor substrate 1 between the diffusion layers 2. There is formed a gate electrode 22 on the gate oxide film 21. The gate electrode 22 and the gate oxide film 21 are covered at their side surfaces with sidewalls 23.

Then, a resultant is covered with a first interlayer insulating film 4. Then, there are formed contact holes 5 by photolithography and etching. The contact holes 5 pass through the first interlayer insulating film 4 and reach the diffusion layers 2. Then, there is formed a barrier metal film 12 on an inner surface of the contact holes 5. The barrier metal film is constituted of an about 30 nm-thick titanium film and an about 100 nm-thick titanium nitride film. Then, a resultant is covered with a tungsten film 13 by CVD employing $WF_6$ and $H_2$ gases as source gases. Then, the tungsten film 13 is etched back to thereby fill the contact holes 5 with tungsten 13.

Then, a first wiring layer 6 is formed over a resultant by sputtering, and subsequently patterned in a desired pattern by photolithography and reactive ion etching. Then, a hydrogenated amorphous carbon film 7 as a second interlayer insulating film is formed by about 0.1 μm over a resultant, and a fluorinated amorphous carbon film 8 also as a second interlayer insulating film is formed by about 1.0 μm over the hydrogenated amorphous carbon film 7.

Then, photoresist 9 as a photosensitive organic film is formed by about 1.0 μm over the fluorinated amorphous carbon film 8. Then, the photoresist 9 is exposed to light at a portion where via-holes 10 are to be formed, and developed to thereby remove the portion of the photoresist 9. With the photoresist 9 being partially removed, reactive ion etching (RIE) is carried out to thereby etch the fluorinated amorphous carbon 8 and the hydrogenated amorphous carbon 7. As a result, there are formed via-holes 10, as illustrated in FIG. 2A. Since the photoresist 9 is exposed to plasma during the reactive ion etching, there is formed a cured layer 11 at the top of the photoresist 9, as illustrated in FIG. 2A.

Figure 2B:
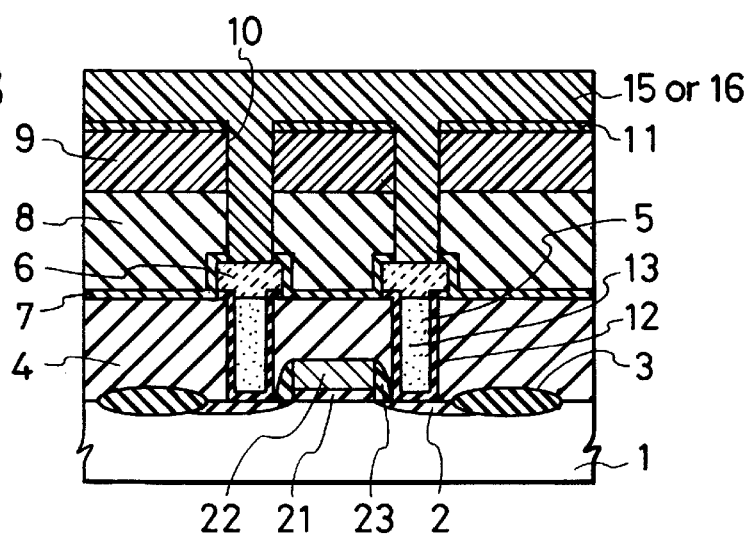

Then, photoresist 15 is applied all over a resultant. By the application of the photoresist 15, the via-holes 10 are filled with the photoresist 15, as illustrated in FIG. 2B.

Figure 2C:
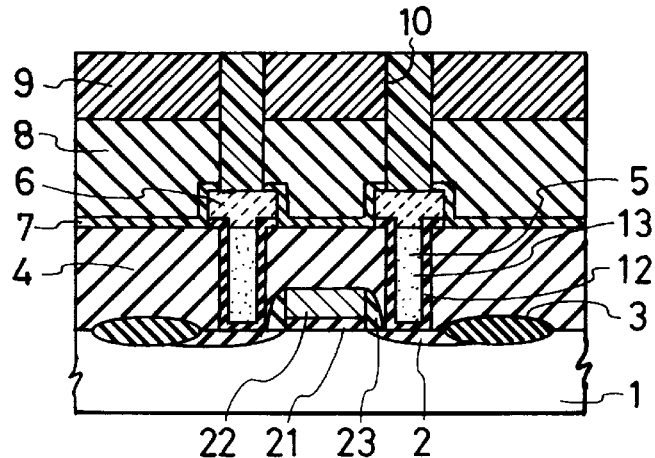

Then, as illustrated in FIG. 2C, a resultant is exposed to plasma in oxygen atmosphere so that both a portion of the photoresist 15 lying over the cured layer 11 and the cured layer 11 are removed.

Figure 2D:
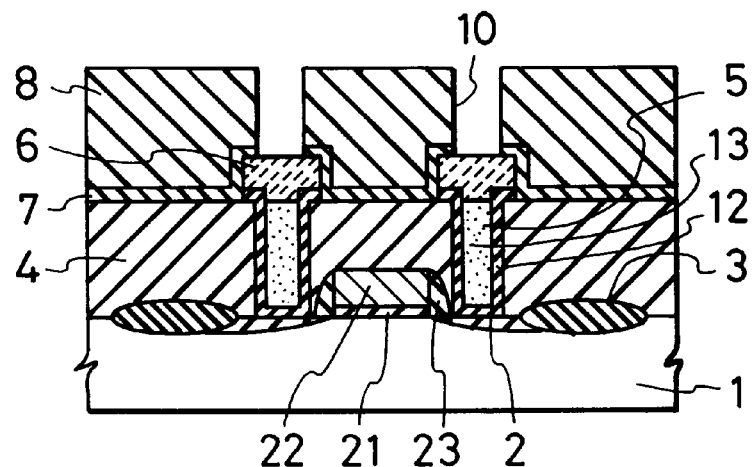

Then, the photoresist 9 lying over the fluorinated amorphous carbon 8 and the photoresist 15 remaining in the via-holes 10 are removed by organic release solution containing phenol and dichlorobenzene and so on, as illustrated in FIG. 2D.

Figure 2E:
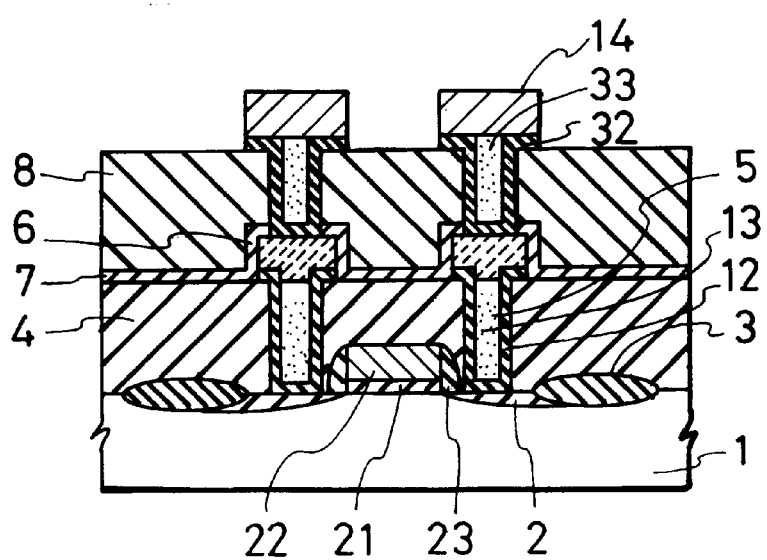

Then, as illustrated in FIG. 2E, a barrier metal film 32 is formed on an inner surface of the via-holes 10. The barrier metal film 32 consists of an about 30 nm-thick titanium film and an about 100 nm-thick titanium nitride film. Then, a tungsten film 33 is deposited over a resultant by CVD employing $WF_6$ and $H_2$ gases as source gases. Thereafter, a resultant is etched back to thereby fill the via-holes 10 with tungsten 33. Then, an aluminum layer 14 as a second wire is deposited over a resultant by sputtering, and thereafter is patterned in a desired pattern, as illustrated in FIG. 2E.

Figure 3:
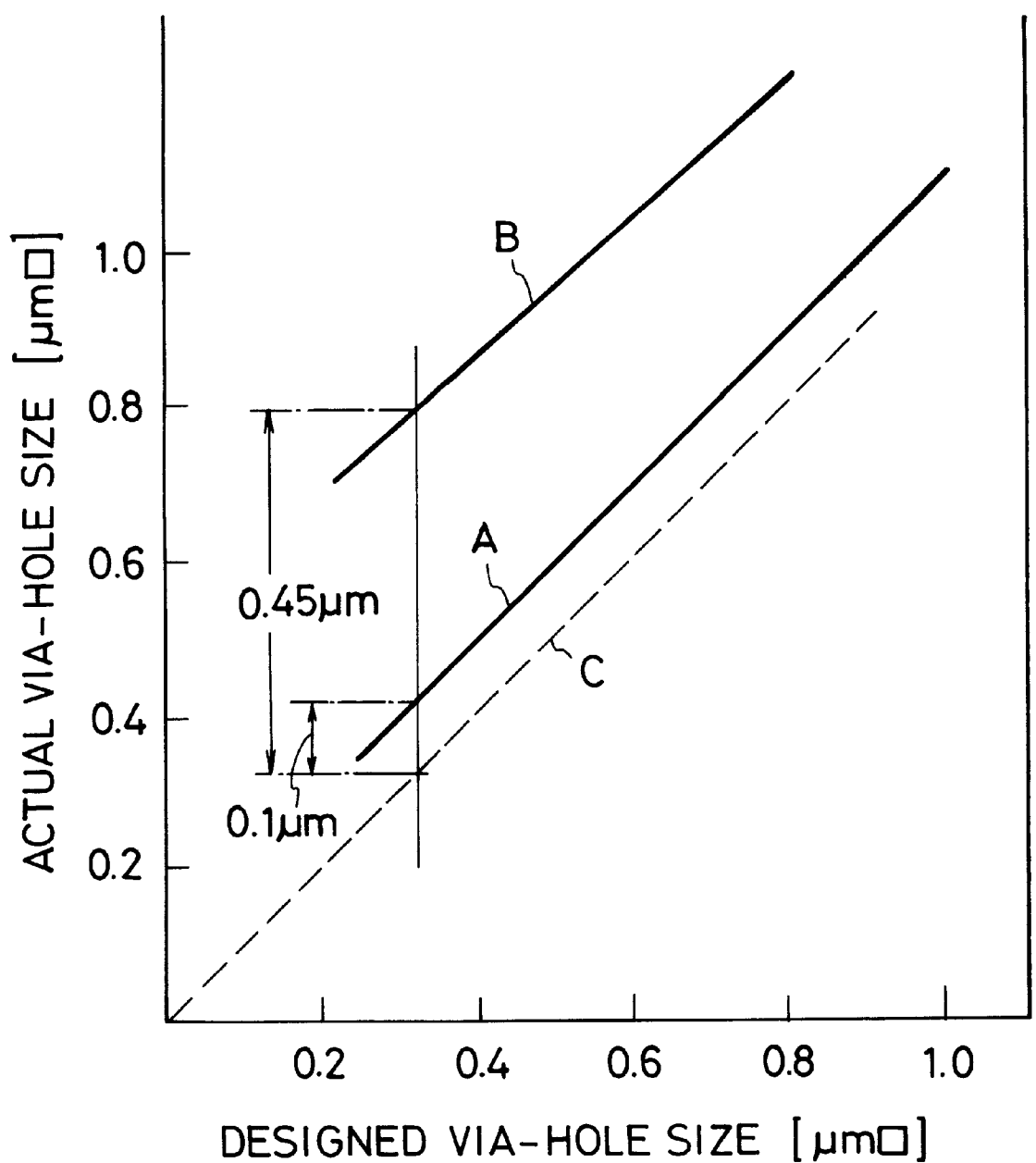
FIG. 3 is a graph for comparing a side length of a via-hole formed in accordance with the present invention to a side length of a via-hole formed in accordance with a convention method.

Hereinbelow comparison is made between a side length of via-holes formed in accordance with the instant embodiment and a side length of via-holes formed in accordance with the conventional method. In FIG. 3, the line A indicates a side length of via-holes formed in accordance with the instant embodiment, whereas the line B indicates a side length of via-holes formed in accordance with the conventional method. The broken line C indicates that there is no difference in a side length between a designed side length and an actual side length. That is, the broken line C makes a reference line. FIG. 3 illustrates a case where via-holes are designed to have a side length in the range of 0.8 μm to 0.3 μm.

As shown in FIG. 3, a difference between a side length of via-holes formed in accordance with the conventional method and a designed side length, namely a difference between the line B and the reference line C is always about 0.45 μm. In contrast, a difference between a side length of via-holes formed in accordance with the instant embodiment and a designed side length, namely a difference between the line A and the reference line C is merely about 0.1 μm. This shows that the instant embodiment is quite effective for preventing an inner wall of a via-hole from being etched when a cured layer formed on photoresist is removed by plasma in oxygen atmosphere.

The second embodiment in accordance with the present invention is explained hereinbelow also with reference to FIGS. 2A to 2E. The second embodiment has the same steps as those of the first embodiment until the cured layer 11 is formed on the photoresist 9, as illustrated in FIG. 2A.

Then, polyimide 16 is applied all over a resultant. By the application of the polyimide 16, the via-holes 10 are filled with the polyimide 16, as illustrated in FIG. 2B.

Then, as illustrated in FIG. 2C, a resultant is exposed to plasma in oxygen atmosphere so that both a portion of the polyimide 16 lying over the cured layer 11 and the cured layer 11 are removed.

Then, the photoresist 9 lying over the fluorinated amorphous carbon 8 and the polyimide 16 remaining in the via-holes 10 are removed by organic release solution containing phenol and dichlorobenzene and so on, as illustrated in FIG. 2D. Herein, since the polyimide 16 is not thermally treated, it can be removed only by dipping a resultant into the organic release solution.

Then, the second wire 14 is formed above the via-holes 10 in the same manner as that of the above mentioned first embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-102261 filed on Apr. 24, 1996 including specification, claims, drawings and summary is incorporated herein by reference in its entirety.

What is claimed is:

1. A method of removing a cured layer formed on a photosensitive organic film deposited on an interlayer insulating film, a via-hole being formed passing through said cured layer, said photosensitive organic film, and said interlayer insulating film, said method comprising the steps, in sequence, of:

(a) forming a film so that said film covers said cured layer therewith and fills said via-hole therewith;

(b) exposing said film to plasma so that said cured layer and a portion of said film lying over said cured layer are removed together; and (c) removing exclusively both said photosensitive organic film and said film remaining in said via-hole.

2. The method as set forth in claim 1, wherein said interlayer insulating film contains amorphous carbon therein.

3. The method as set forth in claim 1, wherein said interlayer insulating film includes a hydrogenated amorphous carbon film and a fluorinated amorphous carbon deposited on said hydrogenated amorphous carbon film.

4. The method as set forth in claim 1, wherein said photosensitive organic film is made of photoresist.

5. The method as set forth in claim 1, wherein said film is made of photoresist.

6. The method as set forth in claim 1, wherein said film is made of polyimide.

7. The method as set forth in claim 1, wherein said film is made of the same material as material of which said photosensitive organic film is made.

8. A method of fabricating a semiconductor, comprising the steps, in sequence, of:

(a) forming a first interlayer insulating film over a semiconductor substrate;

(b) forming an electrically conductive contact hole in said first interlayer insulating film;

(c) forming a second interlayer insulating film over said first interlayer insulating film;

(d) forming a photosensitive organic film over said second interlayer insulating film;

(e) forming a via-hole passing through said photosensitive organic film and said second interlayer insulating film, said via-hole being in vertical alignment with said contact hole;

(f) forming a film so that said film covers said photosensitive organic film therewith and fills said via-hole therewith;

(g) exposing said film to plasma so that a portion of said film lying over said photosensitive organic film is removed;

(h) removing exclusively both said photosensitive organic film and said film remaining in said via-hole; and (i) forming a wire above said via-hole.

9. The method as set forth in claim 8, wherein said step (e) comprises the steps of:

(e-1) exposing said photosensitive organic film to light in vertical alignment with said contact hole, and developing exposed portion of said photosensitive organic film; and (e-2) etching said second interlayer insulating film in a selected area to thereby form said via-hole.

10. The method as set forth in claim 9, wherein reactive ion etching is carried out in said step (e-2) to etch said second interlayer insulating film.

11. The method as set forth in claim 8, wherein said first interlayer insulating film contains amorphous carbon therein.

12. The method as set forth in claim 8, wherein said first interlayer insulating includes a hydrogenated amorphous carbon film and a fluorinated amorphous carbon deposited on said hydrogenated amorphous carbon film.

13. The method as set forth in claim 8, wherein said photosensitive organic film is made of photoresist.

14. The method as set forth in claim 8, wherein said film is made of photoresist.

15. The method as set forth in claim 8, wherein said film is made of polyimide.

16. The method as set forth in claim 8, wherein said film is made of the same material as material of which said photosensitive organic film is made.

* * * * *